(12) United States Patent
Zheng et al.

(10) Patent No.: US 8,039,913 B2
(45) Date of Patent: Oct. 18, 2011

(54) MAGNETIC STACK WITH LAMINATED LAYER

(75) Inventors: Yuankai Zheng, Bloomington, MN (US); Zheng Gao, San Jose, CA (US); Xuebing Feng, Chanhassen, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 204 days.

(21) Appl. No.: 12/425,451

(22) Filed: Apr. 17, 2009

(65) Prior Publication Data

US 2010/0090261 A1    Apr. 15, 2010

Related U.S. Application Data

(60) Provisional application No. 61/104,075, filed on Oct. 9, 2008.

(51) Int. Cl.
*H01L 29/82* (2006.01)
(52) U.S. Cl. ............... 257/421; 257/422; 257/E29.001; 257/E29.323
(58) Field of Classification Search .......... 257/421, 257/E29.001, E29.323, 422; 360/324.1, 360/324.2
See application file for complete search history.

(56) References Cited

U.S. PATENT DOCUMENTS

| | | | |
|---|---|---|---|
| 4,733,371 A | 3/1988 | Terada | |
| 5,191,223 A | 3/1993 | Munekata | |
| 5,646,419 A | 7/1997 | McCaldin | |
| 5,673,225 A | 9/1997 | Jeong | |
| 5,761,115 A | 6/1998 | Kozocki | |
| 5,920,446 A | 7/1999 | Gill | |
| 5,982,670 A | 11/1999 | Yamashita | |
| 6,072,718 A | 6/2000 | Abraham | |
| 6,178,136 B1 | 1/2001 | Lin | |
| 6,226,197 B1 | 5/2001 | Nishimura | |
| 6,252,796 B1 | 6/2001 | Lenssen | |
| 6,381,106 B1 | 4/2002 | Pinarbasi | |
| 6,469,926 B1 | 10/2002 | Chen | |
| 6,532,164 B2 | 3/2003 | Redon | |
| 6,542,000 B1 | 4/2003 | Black | |
| 6,569,745 B2 | 5/2003 | Hsu | |
| 6,584,016 B2 | 6/2003 | Park | |
| 6,603,677 B2 | 8/2003 | Redon et al. | |
| 6,633,498 B1 | 10/2003 | Engel | |

(Continued)

FOREIGN PATENT DOCUMENTS

GB    2 422 735    8/2006

(Continued)

OTHER PUBLICATIONS

U.S. Appl. No. 12/416,976, filed Apr. 2, 2009, Inventor: Zheng.

(Continued)

*Primary Examiner* — Caridad Everhart
(74) *Attorney, Agent, or Firm* — Campbell Nelson Whipps LLC (57) ABSTRACT

A magnetic stack with a multilayer free layer having a switchable magnetization orientation, the free layer comprising a first ferromagnetic portion and a second ferromagnetic portion with an electrically conducting non-magnetic intermediate layer between the first portion and the second portion. The magnetic stack also includes a first ferromagnetic reference layer having a pinned magnetization orientation, a first non-magnetic spacer layer between the free layer and the first reference layer, a second ferromagnetic reference layer having a pinned magnetization orientation, and a second non-magnetic spacer layer between the free layer and the second reference layer.

18 Claims, 4 Drawing Sheets

U.S. PATENT DOCUMENTS

| | | |
|---|---|---|
| 6,639,830 B1 | 10/2003 | Heide |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevin |
| 6,711,067 B1 | 3/2004 | Kablanian |
| 6,714,444 B2 | 3/2004 | Huai et al. |
| 6,741,492 B2 | 5/2004 | Nii |
| 6,744,086 B2 | 6/2004 | Daughton |
| 6,759,263 B2 | 7/2004 | Ying |
| 6,765,819 B1 | 7/2004 | Bhatacharyya |
| 6,774,391 B1 | 8/2004 | Cowburn |
| 6,781,867 B2 | 8/2004 | Kurth |
| 6,781,871 B2 | 8/2004 | Park |
| 6,801,415 B2 | 10/2004 | Slaughter |
| 6,818,961 B1 | 11/2004 | Rizzo |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,703 B2 | 5/2005 | Dieny et al. |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissel |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Pancula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai et al. |
| 7,241,632 B2 | 7/2007 | Vang |
| 7,242,045 B2 | 7/2007 | Nguyen et al. |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Huai |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apalkov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,728,622 B2 | 6/2010 | Chua-Eoan et al. |
| 2003/0011945 A1* | 1/2003 | Yuasa et al. ................ 360/324.1 |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1* | 3/2005 | Gill ................................ 360/314 |
| 2005/0117391 A1* | 6/2005 | Yoda et al. ..................... 365/171 |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1* | 8/2005 | Nguyen et al. ................ 335/173 |
| 2005/0185459 A1 | 8/2005 | Fukuzumi |
| 2005/0237787 A1 | 10/2005 | Huai |
| 2005/0254286 A1 | 11/2005 | Valet |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1* | 6/2006 | Huai et al. ......................... 438/3 |
| 2006/0171199 A1 | 8/2006 | Ju |
| 2006/0233017 A1 | 10/2006 | Hosotami |
| 2006/0245117 A1 | 11/2006 | Nowak |
| 2007/0002504 A1 | 1/2007 | Huai et al. |
| 2007/0007609 A1 | 1/2007 | Saito |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apakov |
| 2007/0096229 A1 | 5/2007 | Yoshikawa |
| 2007/0120210 A1 | 5/2007 | Yuan |
| 2007/0132049 A1 | 6/2007 | Stipe |
| 2007/0164380 A1 | 7/2007 | Min |
| 2007/0171694 A1 | 7/2007 | Huai |
| 2007/0230233 A1 | 10/2007 | Takahashi |
| 2007/0241392 A1 | 10/2007 | Lin |
| 2007/0246787 A1 | 10/2007 | Wang |
| 2007/0297220 A1 | 12/2007 | Yoshikawa |
| 2008/0026253 A1 | 1/2008 | Yuasa |
| 2008/0055792 A1 | 3/2008 | Zheng |

| | | | |
|---|---|---|---|
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0258247 A1 | 10/2008 | Mancoff |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2009/0302403 A1 | 12/2009 | Nguyen |
| 2010/0034009 A1 | 2/2010 | Lu |
| 2010/0118600 A1 | 5/2010 | Nagasi |
| 2010/0176471 A1 | 7/2010 | Zhu |

FOREIGN PATENT DOCUMENTS

WO    WO 2008/100868    8/2008

OTHER PUBLICATIONS

Baek et al., Tech. Dig. IEDM (2004) 587.
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
Cowburn et al., Room Temperature Magnetic Quantum Cellular Automata, Science 287, 1466 (2000).
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15, 1997.
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-L1060.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activiated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15, 2003.
Macak et al., High-Aspect-Ratio TiO2, Nanotubes by Anodization of Titanium, Angew. Chem. Int. Ed. 2005, 44, 2100-2102.
Masuda and Kenji Fukuda, Science, 268, 1466, (Sep. 1995).
Masuda et al., Ordered Metal Nanohole Arrays Made by a Two-Step Replication of Honeycomb Structures of Anodic Alumina, Science, OI. 268, Jun. 9, 1995.
Meng et al., A Spintronics Full Adder for Magnetic CPU, IEEE Elec. Dev. Lett. 26, 360 (2005).

Meng et al., Spin Transfer in Nanomagnetic Devices with Perpendicular Anistropy, Applied Physics Letters 88, 172506 (2006).
Miura et al., A Novel SPRAM (Spin Transfer Torque RAM) with a Synthetic Ferrimagnetic Free Layer . . . , VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Oct. 4, 2010.
PCT Search Report and Written Opinion dated Mar. 10, 2010.
PCT Search Report and Written Opinion dated Mar. 22, 2010.
Prejbeanu et al., Thermally Assisted MRAM, J. Phys. Condens. Matter 19 (2007) 165218 (23 pp).
Seki et al., Spin-Polarized Current-Induced Magnetization Reversal in Perpendicularly Magnetized L1o-FePt Layers, Applied Physics Letters 88, 172504 (2006).
Sharrock, Time Dependence of Switching Fields in Magnetic Recording Media (Invited), J. Appl. Phys. 76 (10), Nov. 15, 1994.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/106,382, filed Apr. 21, 2008, Inventors: Xi et al.
U.S. Appl. No. 12/125,975, filed May 23, 2008, Inventor: Xi.
U.S. Appl. No. 12/126,014, filed May 23, 2008, Inventor: Xiaohua Lou.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,887, filed Sep. 29, 2008; Inventor: Zheng.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/396,905, filed Mar. 3, 2009, Inventor: Gao.
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin SiO2 Films Grown on Mo(112), 2005, Phys. Rev. vol. B72, pp. 1150409-1-115409.0.
Yan et al., Magnesium Oxide as a Candidate High-k Gate Dielelectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Low Switching Current Flux-Closed Magnetoresistive Random Access Memory, Journal of Applied Physics, May 15, 2003.
Zheng et al., Magnetic Random Access Memory (MRAM), Journal of Nanoscience and Nanotechnology, vol. 7, 117-137 (2007).
Zhuang et al., Tech Dig. IEDM (2002) 193.
U.S. Appl. No. 12/239,807, filed Sep. 29, 2008, Inventor: Zheng.
U.S. Appl. No. 12/239,882, filed Sep. 29, 2008, Inventor: Zheng et al.
U.S. Appl. No. 12/269,537, filed Nov. 12, 2008, Inventor: Tang et al.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/398,214, filed Mar. 5, 2009, Inventor: Wang et al.
U.S. Appl. No. 12/425,457, filed Apr. 17, 2009, Inventor: Gao.
L. Berger, "Emission of Spin Waves by a Magnetic Multilayer Traversed by a Current," Physical Review B, vol. 54, No. 13, pp. 9353-9358, (Oct. 1996).
J.C. Slonczewski, "Current-Driven Excitation of Magnetic Multilayers", Journal of Magnetism and Magnetic Materials, 159 (1996) L1-L7.
J. Z. Sun, "Spin-Current Interaction with a Monodomain Magnetic Body: A Model Study", Physical Review B, vol. 62, No. 1, (2000), pp. 570-578.

* cited by examiner

MAGNETIC STACK WITH LAMINATED LAYER

RELATED APPLICATION

This application claims priority to U.S. provisional patent application No. 61/104,075, filed on Oct. 9, 2008 and titled "Dual STRAM with Laminated Free Layer". The entire disclosure of application No. 61/104,075 is incorporated herein by reference.

BACKGROUND

Fast growth of the pervasive computing and handheld/communication industry has generated exploding demand for high capacity nonvolatile solid-state data storage devices and rotating magnetic data storage devices. Current technology like flash memory has several drawbacks such as slow access speed, limited endurance, and the integration difficulty. Flash memory (NAND or NOR) also faces scaling problems. Also, traditional rotating storage faces challenges in increasing areal density and in making components like reading/recording heads smaller and more reliable.

Resistive sense memories are promising candidates for future nonvolatile and universal memory by storing data bits as either a high or low resistance state. One such memory, magnetic random access memory (MRAM), features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. Current induced spin-torque may alternately be used to switch the magnetization of an MTJ in STRAM memories. As the MTJ size shrinks, the switching magnetic field amplitude increases and the switching variation becomes more severe.

However, many yield-limiting factors must be overcome before such magnetic stacks can reliable be used as memory devices or field sensors. Therefore, magnetic stacks with increased layer uniformity are desired. One concern in traditional STRAM design is the thickness tradeoff of the free layer of the STRAM cell. A thicker free layer improves the thermal stability and data retention but also increases the switching current requirement since it is proportional to the thickness of the free layer. Thus, the amount of current required to switch the STRAM cell between resistance data states is large.

BRIEF SUMMARY

The present disclosure relates to a magnetic stack, such as a spin torque memory cell, or magnetic tunnel junction cell, that has a multilayer laminated free layer.

One particular embodiment of this disclosure is a magnetic stack comprising a multilayer free layer having a switchable magnetization orientation, the free layer comprising a first ferromagnetic portion and a second ferromagnetic portion, with an electrically conducting non-magnetic intermediate layer between the first portion and the second portion. The magnetic stack also includes a first ferromagnetic reference layer having a pinned magnetization orientation, a first non-magnetic spacer layer between the free layer and the first reference layer, a second ferromagnetic reference layer having a pinned magnetization orientation, and a second non-magnetic spacer layer between the free layer and the second reference layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same or similar number.

DETAILED DESCRIPTION

This disclosure is directed to magnetic stacks (e.g., spin torque memory (STRAM) cells and read sensors) that include an electrically conductive intermediate material within the ferromagnetic free layer. By including such an intermediate layer within the free layer in a magnetic stack having dual reference layers, the consistency and smoothness of various layers of the stack are improved, reducing interlayer coupling.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above", "below", etc. may be used in this disclosure. These terms should not be construed as limiting the position or orientation of a structure, but should be used as providing spatial relationship between the structures.

Figure 1A:
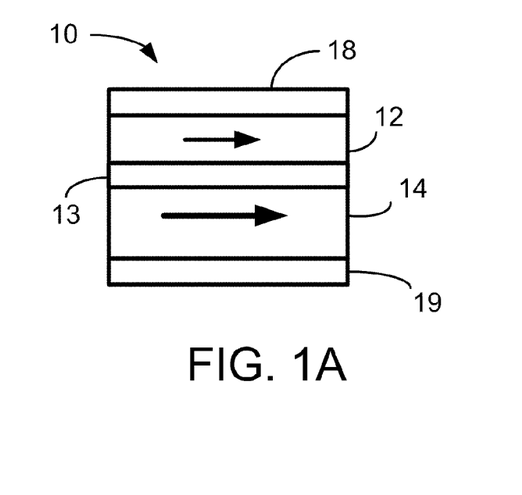
FIG. 1A is a side view diagram of an illustrative magnetic stack, in particular, a magnetic memory cell with in-plane magnetization orientation in a low resistance state.
Figure 1B:
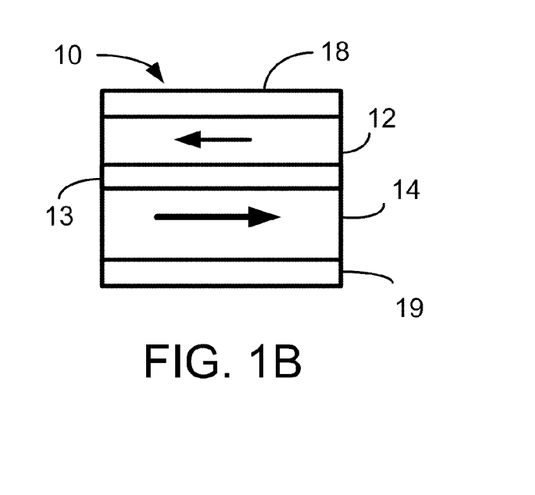
FIG. 1B is schematic side view diagram of the illustrative magnetic stack in a high resistance state.

FIGS. 1A and 1B are cross-sectional schematic diagrams of an illustrative magnetic stack 10. In some embodiments, magnetic stack 10 is a magnetic read sensor such as a magnetic read sensor used in a rotating magnetic storage device. In other embodiments, magnetic stack 10 is a magnetic memory cell and may be referred to as a magnetic tunnel junction cell (MTJ), variable resistive memory cell or variable resistance memory cell or the like.

Magnetic stack 10 includes a relatively soft ferromagnetic free layer 12 and a ferromagnetic reference (i.e., fixed or pinned) layer 14. Ferromagnetic free layer 12 and ferromagnetic reference layer 14 are separated by an electrically insulating and non-magnetic barrier layer, such as an oxide barrier layer 13. Other layers, such as seed or capping layers, are not depicted for clarity. Any or all of layers 12, 13, 14 may be made by thin film techniques such as chemical vapor deposition (CVD), physical vapor deposition (PVD), and atomic layer deposition (ALD).

Free layer 12 and reference layer 14 each have an associated magnetization orientation; the magnetization orientation of free layer 12 being more readily switchable than the magnetization orientation of reference layer 14. In some embodiments, proximate ferromagnetic reference layer 14 is an anti-ferromagnetic (AFM) pinning layer that pins the magnetization orientation of reference layer 14 by exchange bias with the antiferromagnetically ordered material of the pinning layer. Examples of suitable pinning materials include PtMn, IrMn, and others. In alternate embodiments, other mechanisms or elements may be used to pin the magnetization orientation of reference layer 14. In the illustrated embodiment, free layer 12 is above reference layer 14; in other embodiments, reference layer 14 may be above free layer 12.

Ferromagnetic layers 12, 14 may be made of any useful ferromagnetic (FM) material such as, for example, Fe, Co or Ni and alloys thereof, such as NiFe and CoFe. Ternary alloys, such as CoFeB, may be particularly useful because of their lower moment and high polarization ratio. Either or both of free layer 12 and reference layer 14 may be either a single layer or an unbalanced synthetic antiferromagnetic (SAF) coupled structure, i.e., two ferromagnetic sublayers separated by a metallic spacer, such as Ru or Cr, with the magnetization orientations of the sublayers in opposite directions to provide a net magnetization. Barrier layer 13 is made of an electrically insulating material such as, for example an oxide material (e.g., $Al_2O_3$, $TiO_x$ or MgO). Barrier layer 13 could optionally be patterned with free layer 12 or with reference layer 14, depending on process feasibility and device reliability.

A first electrode 18 is in electrical contact with ferromagnetic free layer 12 and a second electrode 19 is in electrical contact with ferromagnetic reference layer 14. Electrodes 18, 19 electrically connect ferromagnetic layers 12, 14 to a control circuit providing read and/or write currents through layers 12, 14. The resistance across magnetic stack 10 is determined by the relative orientation of the magnetization vectors or magnetization orientations of ferromagnetic layers 12, 14. The magnetization direction of reference layer 14 is pinned in a predetermined direction while the magnetization direction of ferromagnetic free layer 12 is free to rotate, for example, under the influence of a magnetic field or under the influence of spin torque.

In FIG. 1A, magnetic stack 10 is in the low resistance state where the magnetization orientation of free layer 12 is parallel and in the same direction as the magnetization orientation of reference layer 14. This is termed the low resistance state. In FIG. 1B, magnetic stack 10 is in the high resistance state where the magnetization orientation of free layer 12 is anti-parallel and in the opposite direction of the magnetization orientation of reference layer 14. This is termed the high resistance state. In some embodiments, the low resistance state represents data state "0" and the high resistance state represents data state "1", whereas in other embodiments, the low resistance state is "1" and the high resistance state is "0".

Switching the resistance state and hence the data state of magnetic stack cell 10 (e.g., when magnetic stack 10 is a magnetic memory cell, such as a magnetic tunnel junction cell) may be done via spin-transfer when a current, passing through a magnetic layer of magnetic stack 10, becomes spin polarized and imparts a spin torque on free layer 12. When a sufficient spin torque is applied to free layer 12, the magnetization orientation of free layer 12 can be switched between two opposite directions and accordingly, magnetic stack 10 (e.g., magnetic tunnel junction memory cell) can be switched between the parallel state (i.e., low resistance state) and anti-parallel state (i.e., high resistance state).

In other embodiments, such as when stack 10 is a magnetic reader head, the magnetization orientation of free layer 12 is influenced by a magnetic field located on a magnetic recording medium proximate the reader head. When a sufficient magnetic field is applied to free layer 12, the magnetization orientation of free layer 12 can be changed among different directions, between the parallel state, the anti-parallel state, and other states.

Figure 2:
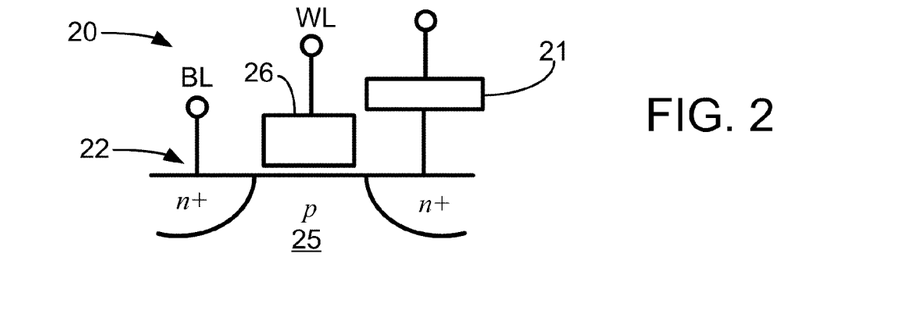
FIG. 2 is a schematic diagram of an illustrative memory unit including a memory cell and a semiconductor transistor.

FIG. 2 is a schematic diagram of an illustrative memory unit 20 including a memory element 21 electrically coupled to a semiconductor transistor 22 via an electrically conducting element. Memory element 21 may be a memory cells described herein, or may be any other magnetic memory cell. Transistor 22 includes a semiconductor substrate 25 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory element 21. An array of programmable metallization memory units 20 can be formed on a semiconductor substrate utilizing semiconductor fabrication techniques.

Figure 3:
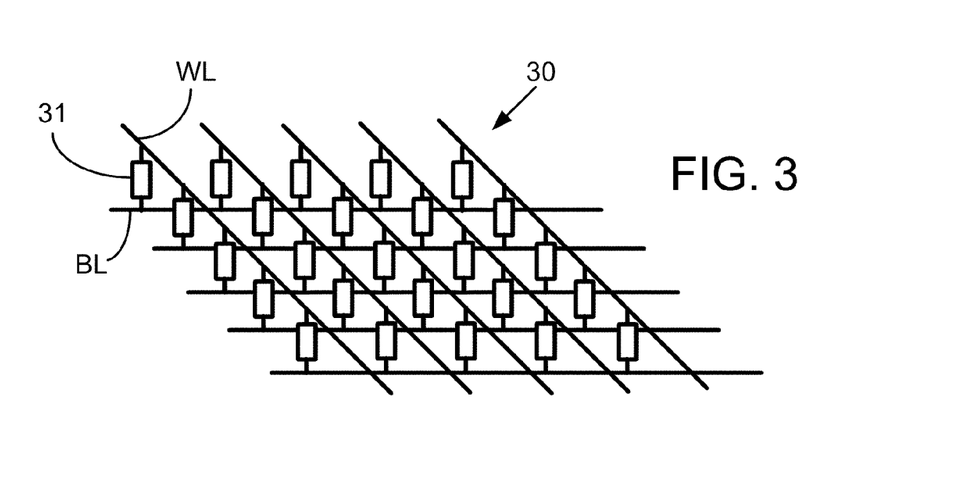
FIG. 3 is a schematic diagram of an illustrative memory array.

FIG. 3 is a schematic diagram of an illustrative memory array 30. Memory array 30 includes a plurality of word lines WL and a plurality of bit lines BL forming a cross-point array. At each cross-point a memory element 31 is electrically coupled to word line WL and bit line BL. Memory element 31 may be any of the memory cells described herein, or may be any other magnetic memory cell.

Magnetic memory cells (such as those of FIGS. 1A and 1B) having a data state switchable by spin torque, generally have an in-plane anisotropy of $2\pi Ms$. For a free layer 12 composed of NiFe, the in-plane anisotropic field is around 5000 Oe. However, the uni-axial anisotropic field, which stabilizes the cell against thermal excitations and provides the long term data retention, is only around 500 Oe. If the in-plane anisotropy can be reduced while increasing the uni-axial anisotropy field, one can obtain ST RAM cells that switch easier (i.e., with less switching current) yet have higher thermal stability and better retention. Magnetic stacks having dual reference layers with a free layer having a low saturated magnetic moment (Ms) are one means to reduce the switching current.

Figure 4:
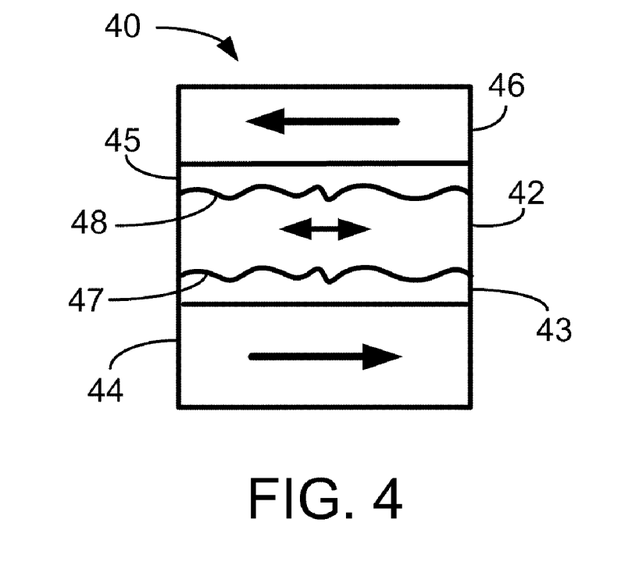
FIG. 4 is a side view diagram of an illustrative magnetic stack having dual reference layers.

FIG. 4 is an illustrative magnetic stack 40 having dual or two ferromagnetic reference layers having a pinned magnetization orientation with a ferromagnetic free layer therebetween. In general, the various elements, features and materials of magnetic stack 40 are the same as or similar to the various elements, features and materials of magnetic stack 10 of FIGS. 1A and 1B, unless indicated otherwise.

Magnetic stack 40 has a relatively soft ferromagnetic free layer 42, a first ferromagnetic reference (i.e., fixed or pinned) layer 44 and a second ferromagnetic reference (i.e., fixed or pinned) layer 46. Second reference layer 46 may be the same as or different than first reference layer 44, for example, in material and/or thickness. Free layer 42 and first reference layer 44 are separated by an electrically insulating and non-magnetic barrier layer 43, and free layer 42 and second reference layer 46 are separated by a second electrically insulating and non-magnetic barrier layer 45. Second barrier layer 45 may be the same as or different than first barrier layer 43, for example, in material and/or thickness. Other layers, such as seed or capping layers, or pinning layers, are not depicted for clarity. Also not illustrated are the electrodes electrically connected to layers 42, 44, 46.

Ferromagnetic layers 42, 44, 46 may be made of any useful ferromagnetic (FM) material such as, for example, Fe, Co or Ni and alloys thereof, such as NiFe, CoFe, and CoFeB. Any or all of free layer 42 and reference layers 44, 46 may be either a single layer or an unbalanced synthetic antiferromagnetic (SAF) coupled structure. In some embodiments, ferromagnetic layers 42, 44, 46, particularly free layer 42, is formed of a ferromagnetic material with acceptable anisotropy and a saturation moment (Ms) that is at least 1000 emu/cc, often at least 1100 emu/cc, and in some embodiments at least 1500 emu/cc, where emu refers to electromagnetic unit of magnetic dipole moment and cc refers to cubic centimeter. In many embodiments, free layer 42 is $Co_{100-X-Y}Fe_XB_Y$, wherein X is greater than 30 and Y is greater than 15. Barrier layers 43, 45 are made of electrically insulating materials such as, for example an oxide material (e.g., $Al_2O_3$, $TiO_x$ or MgO).

Free layer 42 and reference layers 44, 46 each have an associated magnetization orientation; the magnetization orientation of free layer 42 being more readily switchable than the magnetization orientation of reference layers 44, 46. The resistance across magnetic stack 40, and thus data state, is determined by the net relative orientation of the magnetization vectors or magnetization orientations of ferromagnetic layers 42, 44, 46. In FIG. 4, the magnetization orientations of reference layers 44, 46 are opposite to one another. Interlayer coupling on free layer 42 from reference layer 44 is compensated by the interlayer coupling on free layer 42 from reference layer 46. In FIG. 4, the magnetization orientation of free layer 42 is shown as undefined. For ST RAM memory cells, a switching current is passed through cell 40 to switch the magnetization orientation of free layer 42 from one direction to the other.

Magnetic stacks having dual reference layers, such as magnetic stack 40, with a free layer having a low saturated magnetic moment (Ms) are one means to reduce the needed switching current. As the magnetic moment decreases, so does the thermal barrier energy. To implement the reduced switching current, low area resistance (RA) of free layer 42 is desired, usually less than about 100 Ohm/µm²; low RA, however, needs a very thin barrier layer 43, 45 (e.g., no more than about 2 nm, e.g., 0.5 to 1.5 nm). The thin barrier layer 43, 45 results in large interlayer coupling between reference layer 44 and free layer 42 and reference layer 46 and free layer 42, respectively, which is undesired. In order to reduce the offset field from the larger interlayer coupling, a static field from reference layer 46 is required. However, the static field is dependent on the size of cell 40, and any size variation can cause undesired variation in the offset field.

Magnetic stacks having dual reference layers, such as magnetic stack 40, with a free layer having a high saturated magnetic moment (Ms) are another means to reduce the needed switching current while maintaining high thermal stability. In order to achieve high magnetic resistance, crystalline materials (e.g., crystalline MgO) are preferred materials for barrier layer 43 and/or barrier layer 45.

Magnetic stack 40 is manufactured in a bottom to top manner, with the bottom most layer (i.e., first reference layer 44) being formed before any upper layer (i.e., barrier layer 43, free layer 42, etc.). It is not uncommon that the application (e.g., deposition) of crystalline material for first barrier layer 43 results in barrier layer 43 having a non-uniform or rough surface, based on the various factors of barrier layer 43, such as its material, process of forming layer 43, and thickness of layer 43. In most embodiments, this roughness is on an atomic or molecular scale. Over barrier layer 43 is applied (e.g., deposited) free layer 42. The rough surface of layer 43 results in an interface 47 between barrier layer 43 and free layer 42 that is not smooth, but has a roughness associated therewith. This roughness is carried through free layer 42. When second barrier layer 45 and second reference layer 46 are subsequently deposited over free layer 42, the rough interface 48 between free layer 42 and second barrier layer 45 will cause large interlayer coupling between second reference layer 46 and free layer 42.

In addition to the undesired large interlayer coupling, the rough surface of first barrier layer 43 can result in non-uniform thicknesses of any or all of first barrier layer 43, free layer 42, second barrier layer 45 and even second reference layer 46. This is particularly an issue if barrier layer 43 is thin (e.g., less than about 1 nm), as needed for low area resistance requirement (e.g., less than about 50 Ohms/µm²), as pin holes in layer 43 may occur.

Figure 5:
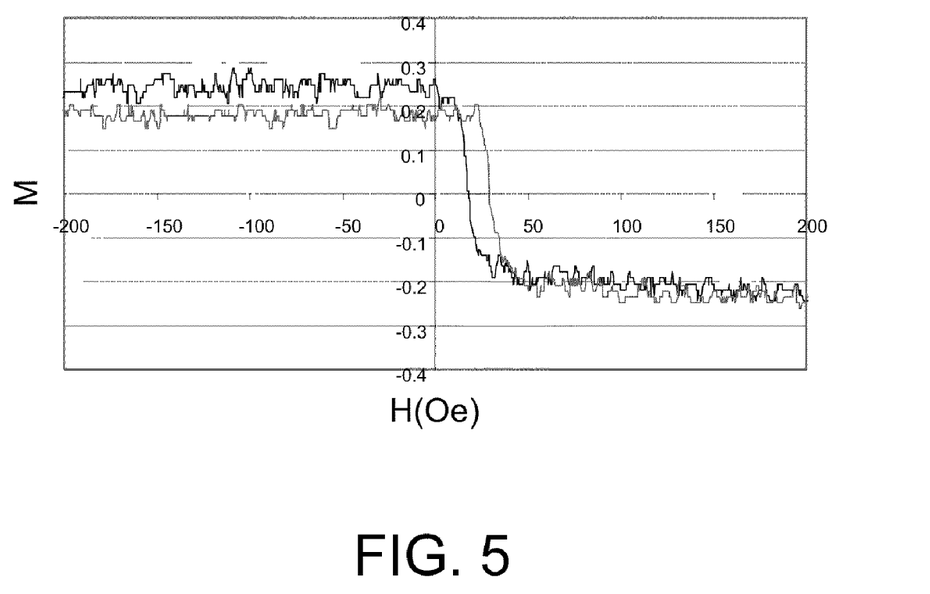
FIG. 5 is a graphical representation of an M-H curve for the free layer of the magnetic stack of FIG. 4.

FIG. 5 illustrates a graphical representation of the magnetization (M)—magnetic field (H) curve of free layer 42 of dual structure magnetic stack 40, when first barrier layer 43 is crystalline MgO at a thickness of about 10 Angstroms and second barrier layer 45 is crystalline MgO at a thickness of about 12 Angstroms. The two curves representing the forward and backward switching of the free layer magnetization. In general, the interlayer coupling decreases as the thickness of either or both barrier layers 43, 45 increases. Additionally, as the thickness of free layer 42 increases, the interlayer coupling decreases.

Figure 6:
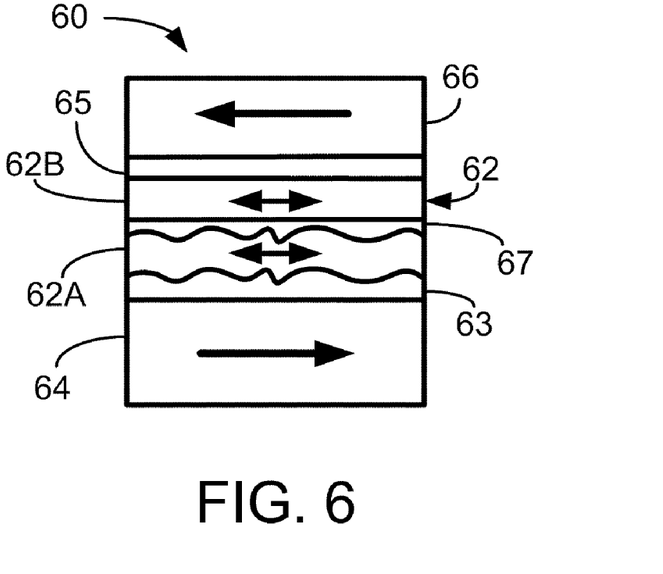
FIG. 6 is a side view diagram of a magnetic stack having dual reference layers and a laminated free layer.

FIG. 6 illustrates a dual reference layer magnetic stack having a multilayer laminated free layer, which addresses the issues described above. In general, the various elements, features and materials of magnetic stack 60 of FIG. 6 are the same as or similar to the various elements, features and materials of magnetic stack 40 of FIG. 4, unless indicated otherwise.

Magnetic stack 60 has a relatively soft ferromagnetic free layer 62, a first ferromagnetic reference (i.e., fixed or pinned) layer 64 and a second ferromagnetic reference (i.e., fixed or pinned) layer 66, which may be the same as or different than first reference layer 64. Free layer 62 and first reference layer 64 are separated by a first electrically insulating and non-magnetic barrier layer 63, and free layer 62 and second reference layer 66 are separated by a second electrically insulating and non-magnetic barrier layer 65, which may be the same or different than first barrier layer 63.

Ferromagnetic free layer 62 is a multilayer layer, composed of at least two different materials present as discrete layers. Free layer 62 includes an electrically conducting, non-magnetic intermediate layer 67, which divides and separates free layer 62 into a first portion 62A and a second portion 62B. First portion 62A and second portion 62B remain strongly ferromagnetically coupled. Together, intermediate layer 67, first portion 62A and second portion 62B are referred to as a multilayer free layer, a laminated free layer, a laminated multilayer, and variations thereof. In some embodiments, free layer 62 may be referred to as a sandwich structure.

The presence of intermediate layer 67 does not modify the total thickness of ferromagnetic material (i.e., first portion 62A and second portion 62B) by more than about 5 Angstroms, thus, allowing the same or similar magnetic resistance has if no intermediate layer 67 were present. Free layer portions 62A and 62B may have the same or different thicknesses. In most embodiments, intermediate layer 67 is at or close to the center of free layer 62, so that first portion 62A and second portion 62B differ in thickness by no more than about 25%, often no more than about 10%. In some embodiments, portion 62A and 62B may be the same ferromagnetic material whereas in other embodiments, free layer portion 62A and 62B are formed of different ferromagnetic materials.

Intermediate layer 67 can be any useful electrically conducting and non-ferromagnetic material such as, for example, Ru, Ta, Pd, Cr, RuO or Pt. Intermediate layer 67 has an area resistance less than about 100 Ohms/$\mu m^2$. The thickness of intermediate layer 67 is usually about 2 to 5 Angstroms.

Intermediate layer 67 has at least two desired functions. The first is to provide a physical break within free layer 62, forming first portion 62A and second portion 62B. By having the electrically conducting, non-magnetic intermediate layer 67 within free layer 62, the upper, second portion 62B does not follow the crystalline structure of first barrier layer 63 nor the structure of first portion 62A. Because of this, second portion 62B can be a ferromagnetic material different than that of first portion 62A, selected to, for example, to modify the other magnetic properties, such as magneto-striction, or coercivity without sacrificing the magneto-resistance. As an example, ferromagnetic first portion 62A may have a high saturation magnetization, such as 1100 emu/cc, while ferromagnetic second portion 62B has a low saturation magnetization, such as 500 emu/cc.

A second effect of intermediate layer 67 is to inhibit the rough surface of barrier layer 63 from being continued through free layer 62, as seen in FIG. 6. First barrier layer 63 has a rough upper surface, which is translated to the upper surface of free layer first portion 62A. Due to, at least, the surface energy and molecular structure of intermediate layer 67, intermediate layer 67 evens out the rough surface, providing a generally smooth surface for free layer second portion 62B. Material from intermediate layer 67 has a desire to settle in crevices and other low regions of any rough surface, thus filling and leveling the rough surface; in some embodiments, this may be referred to as "dusting".

Second barrier layer 65 may be amorphous or crystalline.

Figure 7:
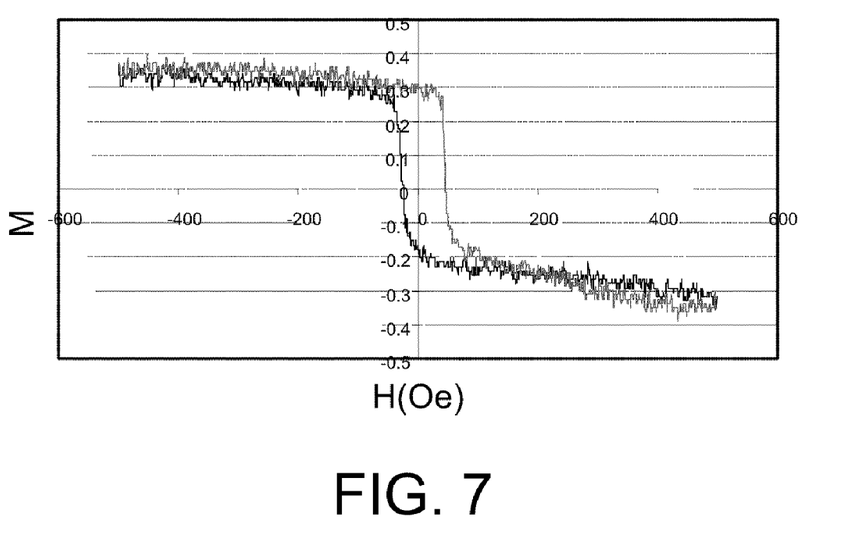
FIG. 7 is a graphical representation of an M-H curve for the free layer of the magnetic stack of FIG. 6.

FIG. 7 illustrates a graphical representation of the magnetization (M)—magnetic field (H) curve of multilayer free layer 62 of dual structure magnetic stack 60, the two curves representing the forward and backward switching of the free layer magnetization. For this embodiment, first barrier layer 63 is crystalline MgO at a thickness of about 10 Angstroms and second barrier layer 65 is crystalline MgO at a thickness of about 9.5 Angstroms. Because of the smooth interface between second portion 62B and second barrier layer 65, a thinner barrier layer 65 can be used. A thinner barrier can also reduce the area resistance (RA). By comparing FIG. 7 with FIG. 5, it is seen that by having a multilayer free layer (e.g., free layer 62) the smoothness of the magnetization is increased with laminated free layer 62.

Figure 8:
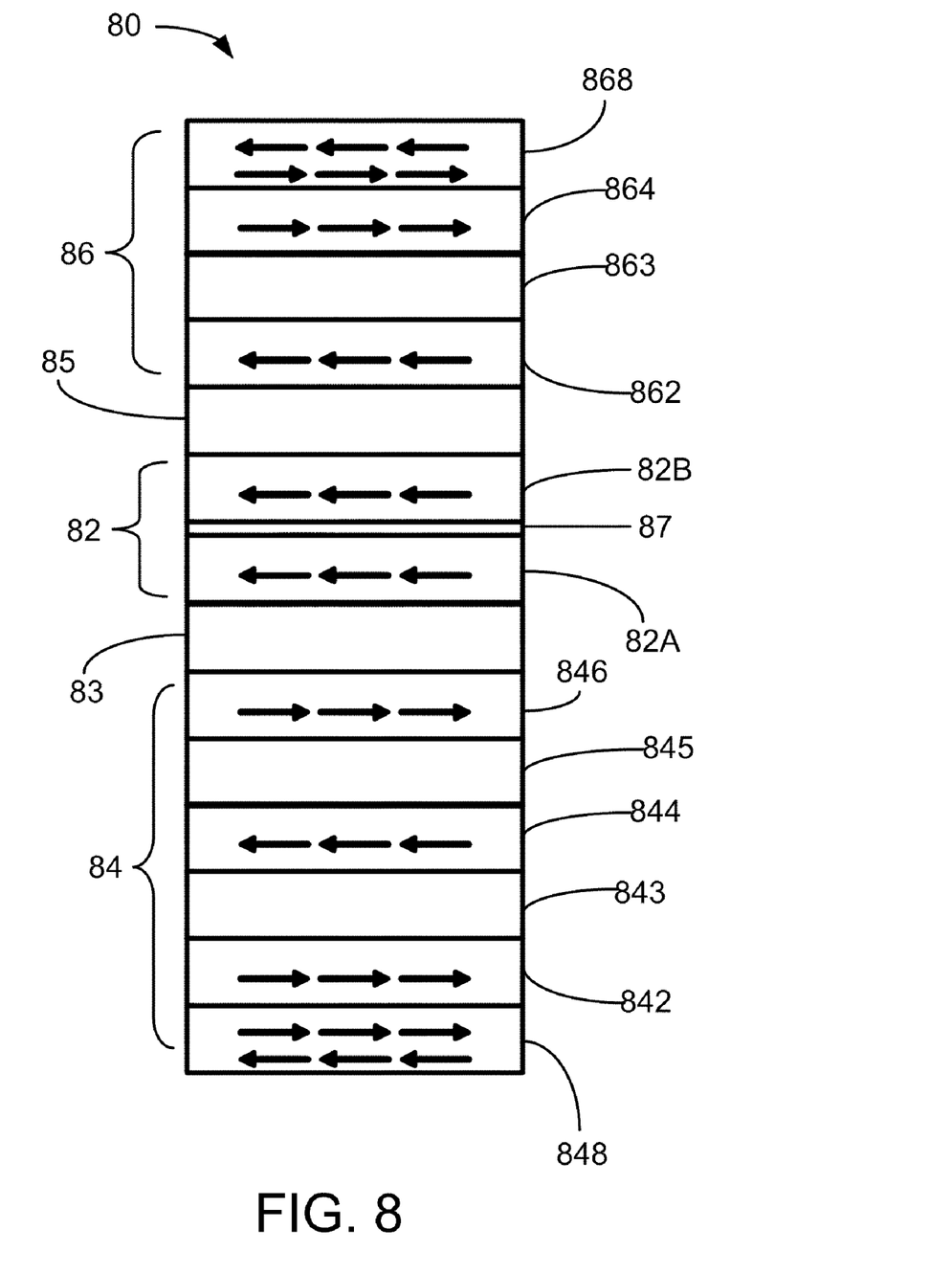
FIG. 8 is a side view diagram of another magnetic stack having dual reference layers and a laminated free layer.

FIG. 8 illustrates an alternate embodiment of a dual reference layer magnetic stack 80 having a multilayer laminated free layer. In this embodiment, the reference layer has two or more pinned ferromagnetic layers, which are strongly coupled antiferromagnetically. This reference multilayer is further fixed by an antiferromagnetic (AFM) layer. In general, the various elements, features and materials of magnetic stack 80 of FIG. 8 are the same as or similar to the various elements, features and materials of magnetic stack 40 of FIG. 4 and magnetic stack 60 of FIG. 6, unless indicated otherwise.

Magnetic stack 80 has a relatively soft ferromagnetic multilayer free layer 82, a first ferromagnetic reference (i.e., fixed or pinned) layer 84 and a second ferromagnetic reference (i.e., fixed or pinned) layer 86, which may be the same as or different than first reference layer 84. Free layer 82 and first reference layer 84 are separated by a first electrically insulating and non-magnetic barrier layer 83, and free layer 82 and second reference layer 86 are separated by a second electrically insulating and non-magnetic barrier layer 85, which may be the same or different than first barrier layer 83.

Ferromagnetic free layer 82 is a multilayer layer, composed of an electronically conducting, non-magnetic intermediate layer 87 that divides and separates free layer 82 into a first portion 82A and a second portion 82B. Together, intermediate layer 87, first portion 82A and second portion 82B are referred to as multilayer free layer 82, laminated free layer 82, laminated multilayer 82, and variations thereof. In some embodiments, free layer 82 may be referred to as a sandwich structure.

In this embodiment, first reference layer 84 is a multilayer unbalanced synthetic antiferromagnetic (SAF) coupled structure, i.e., two ferromagnetic sublayers separated by a metallic spacer, such as Ru, Pd or Cr, with the magnetization orientations of the sublayers in opposite directions to provide a net magnetization. A multilayer SAF has more than one coupled structure. In FIG. 8, reference layer 84 has a first ferromagnetic sublayer 842 separated from a second ferromagnetic sublayer 844 by a first metallic spacer 843, and also has a third ferromagnetic sublayer 846 separated from second ferromagnetic sublayer 844 by a second metallic spacer 845. Included in reference layer 84 is an antiferromagnetic (AFM) pinning layer 848, which pins the magnetization orientation of ferromagnetic sublayer 842 by exchange bias with the antiferromagnetically ordered material of pinning layer 848. Examples of suitable pinning materials include PtMn, IrMn, and others. In alternate embodiments, other mechanisms or elements may be used to pin the magnetization orientation of sublayer 842 or of reference layer 84.

Second reference layer 86 is a single, unbalanced synthetic antiferromagnetic (SAF) coupled structure, i.e., two ferromagnetic sublayers separated by a metallic spacer, such as Ru, Pd or Cr, with the magnetization orientations of the sublayers in opposite directions to provide a net magnetization. Reference layer 86 has a first ferromagnetic sublayer 862 separated from a second ferromagnetic sublayer 864 by a metallic spacer 863. Included in reference layer 86 is an antiferromagnetic (AFM) pinning layer 868, which pins the magnetization orientation of ferromagnetic sublayer 864 by exchange bias with the antiferromagnetically ordered material of pinning layer 868. Other mechanisms or elements may be used to pin the magnetization orientation of sublayer 864 or of reference layer 86.

In one particular embodiment, magnetic stack 80 includes ferromagnetic free layer portions 82A, 82B both formed from CoFeB having a saturated magnetic moment (Ms) of about 1100 emu/cc. Intermediate layer 87 between CoFeB portions 82A, 82B is Ta, Ru or Cr. Metallic spacers 843, 845, 863 of the SAF structures may be any or all of Ru, Pd, and Cr. Barrier layers 83, 85 are MgO.

In another particular embodiment, magnetic stack 80 includes ferromagnetic free layer portions 82A, 82B, one of which is formed from a ferromagnetic material having a low saturated magnetic moment (Ms) of about 500 emu/cc; examples of such materials include NiFe, $Co_{100-X-Y}Fe_XB_Y$, where X is about 10 and Y is about 20. Intermediate layer 87 between portions 82A, 82B is Ta, Ru or Cr. Metallic spacers 843, 845, 863 of the SAF structures may be any or all of Ru, Pd, and Cr. Barrier layers 83, 85 are MgO.

The magnetic stacks of this disclosure, including any or all of the layers, may be made by thin film techniques such as chemical vapor deposition (CVD), physical vapor deposition (PVD), and atomic layer deposition (ALD).

Various other embodiments of a multilayer laminated free layer in magnetic stacks with dual reference layers are within the scope of this disclosure. An electrically conducting, non-magnetic intermediate layer within the free layer provides a smooth surface and broken structure between two free layer portions. The multilayer provides low area resistance, improves the uniformity of the second barrier layer, and provides small interlayer coupling field for the top barrier layer.

Thus, embodiments of the MAGNETIC STACK WITH LAMINATED LAYER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic stack comprising:
    a multilayer free layer having a switchable magnetization orientation, the free layer comprising a first ferromagnetic portion and a second ferromagnetic portion, with an electrically conducting non-magnetic intermediate layer, having a thickness of about 2 to about 5 Angstroms, between the first portion and the second portion;
    a first ferromagnetic reference layer having a pinned magnetization orientation;
    a first non-magnetic spacer layer between the free layer and the first reference layer;
    a second ferromagnetic reference layer having a pinned magnetization orientation; and
    a second non-magnetic spacer layer between the free layer and the second reference layer.

2. The magnetic stack of claim 1 wherein the intermediate layer has an area resistance of less than about 100 Ohms/$\mu m^2$.

3. The magnetic stack of claim 1 wherein the intermediate layer comprises Ru, Ta, Pd, Cr, RuO or Pt.

4. The magnetic stack of claim 1 wherein the first reference layer comprises an unbalanced synthetic antiferromagnetic coupled structure.

5. The magnetic stack of claim 1 wherein the second reference layer comprises an unbalanced synthetic antiferromagnetic coupled structure.

6. The magnetic stack of claim 1 wherein the first portion and the second portion of the free layer comprise CoFeB.

7. The magnetic stack of claim 1 wherein the first portion is a first ferromagnetic material and the second portion is a second ferromagnetic material different than the first ferromagnetic material.

8. The magnetic stack of claim 1 wherein the first portion and the second portion differ in thickness by no more than about 25%.

9. The magnetic stack of claim 1 wherein the magnetic stack is a magnetic tunnel junction memory cell.

10. The magnetic stack of claim 1 wherein the magnetic stack is a magnetic read sensor in a recording head.

11. The magnetic stack of claim 1 wherein the first spacer layer comprises crystalline material.

12. The magnetic stack of claim 11 wherein the first spacer layer comprises crystalline MgO.

13. A magnetic memory device comprising:
    a substrate having a source region and a drain region with a channel region therebetween;
    a gate electrically between the channel region and a word line;
    a magnetic memory cell electrically connected to one of the source region and the drain region, the magnetoelectric cell comprising a multilayer free layer having a switchable magnetization orientation, the free layer comprising a first ferromagnetic portion and a second ferromagnetic portion, with an electrically conducting non-magnetic intermediate layer, having a thickness of about 2 to about 5 Angstroms, between the first portion and the second portion;
    a first line electrically connected to the magnetic memory cell; and
    a second line electrically connected to the other of the source region and the drain region.

14. The memory device of claim 13 wherein the first spacer layer comprises crystalline material.

15. The memory device of claim 14 wherein the first spacer layer comprises crystalline MgO.

16. The memory device of claim 13 wherein the intermediate layer comprises Ru, Ta, Pd, Cr, RuO or Pt.

17. The memory device of claim 13 wherein the first portion is a first ferromagnetic material and the second portion is a second ferromagnetic material different than the first ferromagnetic material.

18. The memory device of claim 13 wherein the first portion and the second portion differ in thickness by no more than about 25%.

* * * * *